United States Patent
Yu

(10) Patent No.: US 6,200,148 B1
(45) Date of Patent: Mar. 13, 2001

(54) MEMORY CARD CONNECTOR

(76) Inventor: Darren Yu, 3Fl-1, No. 492-19, Sec. 1, Wan-Shou Rd., Tao-Yuan Hsien (TW)

( * ) Notice: Subject to any disclaimer, the term of this patent is extended or adjusted under 35 U.S.C. 154(b) by 0 days.

(21) Appl. No.: 09/414,015

(22) Filed: Oct. 6, 1999

(30) Foreign Application Priority Data

Nov. 21, 1998 (TW) ................................................ 87219335

(51) Int. Cl.⁷ ................................................... H01R 13/62
(52) U.S. Cl. ............................................................ 439/159
(58) Field of Search .................................... 439/159, 160, 439/157, 155, 152

(56) References Cited

U.S. PATENT DOCUMENTS

| 5,451,168 | * | 9/1995 | Shuey | 439/159 |
| 6,015,309 | * | 1/2000 | Nakamura et al. | 439/159 |
| 6,017,230 | * | 1/2000 | Yao | 439/159 |
| 6,022,228 | * | 2/2000 | Kuo | 439/159 |

* cited by examiner

*Primary Examiner*—Paula Bradley
*Assistant Examiner*—Tho D. Ta
(74) *Attorney, Agent, or Firm*—Pro-Techtor International Services

(57) ABSTRACT

A memory card connector, which includes a connector body for receiving a memory card, the connector body having a coupling rod with a coupling head, a lever turned about the coupling rod at the connector body, and a push bar coupled to one end of the lever for operation by hand to turn the lever about the coupling rod, for causing the lever to push the installed memory card away from the connector body, wherein the lever has a coupling hole coupled to the coupling rod at the connector body, and two coupling flanges suspended in the coupling hole at two opposite sides and forced into engagement with the coupling head of the coupling rod upon a rotary motion of the lever through an angle relative to the coupling rod after insertion of the coupling rod through the coupling hole at the lever.

8 Claims, 3 Drawing Sheets

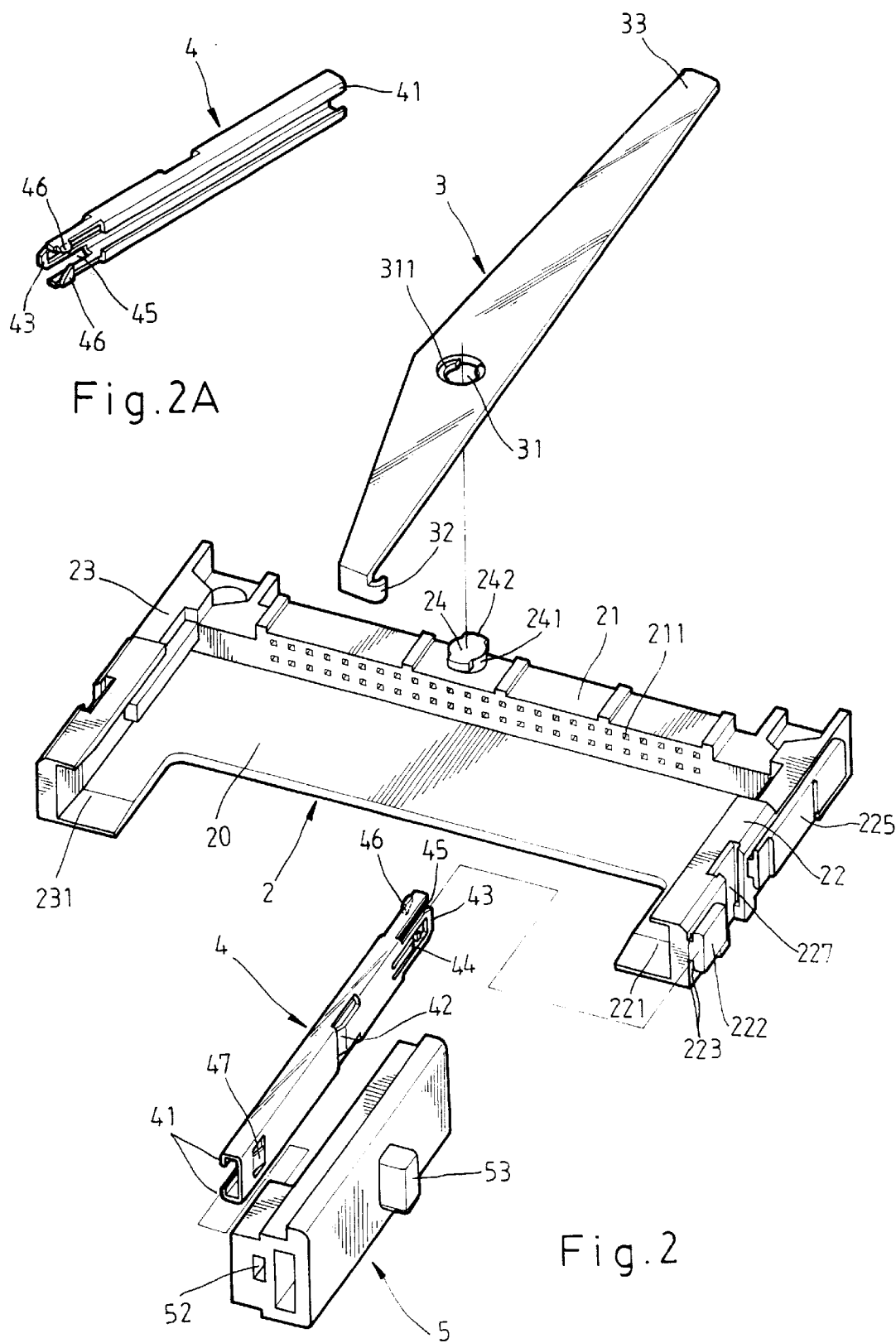

MEMORY CARD CONNECTOR

BACKGROUND OF THE INVENTION

The present invention relates to a memory card connector for use in a mobile computer or digital camera for receiving a memory card, and more particularly to an improved structure of memory card connector, which has a simple structure of memory card ejector mechanism for easy operation by hand to eject the installed memory card.

FIG. 1 shows a memory card connector according to the prior art. This structure of memory card connector comprises a connector body 11, and an ejector mechanism 12. The connector body 11 comprises an elongated terminal holder base 111 having rows of pin holes 114 for receiving the pins of a memory card, two side arms 112 and 113 perpendicularly extended from two distal ends of the elongated terminal holder base 111 in same direction, a flat receiving chamber 110 defined between the side arms 112 and 113 for receiving a memory card, two sliding grooves 1121 and 1131 respectively provided at the side arms 112 and 113 at an inner side for guiding a memory card into position, and a plurality of retaining blocks 1122 and 1123 respectively raised from the side arms 112 and 113 at an outer side for securing the ejector mechanism 12 in place. The ejector mechanism 12 is comprised of a flat shell 121, an ejector rod 122, and a lever 123. The flat shell 121 comprises downward coupling boards 1213, 1214 and 1215 at two opposite lateral sides, an angled flange 1212 at one lateral side defining with the outside wall of one downward coupling board 1215 a space for holding the ejector rod 122. The lever 123 has a pivot hole 1232 on the middle pivotably connected to a pivot hole 1211 at the flat shell 121 by rivet means, a push portion 1231 at one end, and a stop portion 1233 at an opposite end. The stop portion 1233 of the lever 123 is stopped at one end of the ejector rod 122 inside the angled flange 1212. The flat shell 121 is covered on the connector body 11, with the downward coupling boards 1213, 1214 and 1215 forced into engagement with the retaining blocks 1122 and 1123 (the downward coupling boards 1213, 1214 and 1215 have coupling holes for engagement with the retaining blocks 1122 and 1123). This structure of memory card connector is functional, however it is complicated and expensive to manufacture.

SUMMARY OF THE INVENTION

It is one object of the present invention to provide a memory card connector, which has a simple structure of memory card ejector mechanism for ejecting the installed memory card by means of a lever function. It is another object of the present invention to provide a memory card connector, which can easily be assembled without riveting, and positively be operated to eject installed memory card. According to one aspect of the present invention, the memory card connector comprises a connector body for receiving a memory card, the connector body having a coupling rod with a coupling head, a lever turned about the coupling rod at the connector body, and a push bar coupled to one end of the lever for operation by hand to turn the lever about the coupling rod, for causing the lever to push the installed memory card away from the connector body, wherein the lever has a coupling hole coupled to the coupling rod at the connector body, and two coupling flanges suspended in the coupling hole at two opposite sides and forced into engagement with the coupling head of the coupling rod upon a rotary motion of the lever through an angle relative to the coupling rod after insertion of the coupling rod through the coupling hole at the lever. According to another aspect of the present invention, the connector body has a longitudinal track formed integral with one side arm thereof for guiding movement of the push bar, and the push bar has coupling means slidably coupled to the longitudinal track at the connector body.

BRIEF DESCRIPTION OF THE DRAWINGS

FIG. 2 is an exploded view of a memory card connector according to the present invention.

FIG. 2A is a perspective view of the push bar for the memory card connector according to the present invention.

DETAILED DESCRIPTION OF THE PREFERRED EMBODIMENT

Figures 1, 2B:
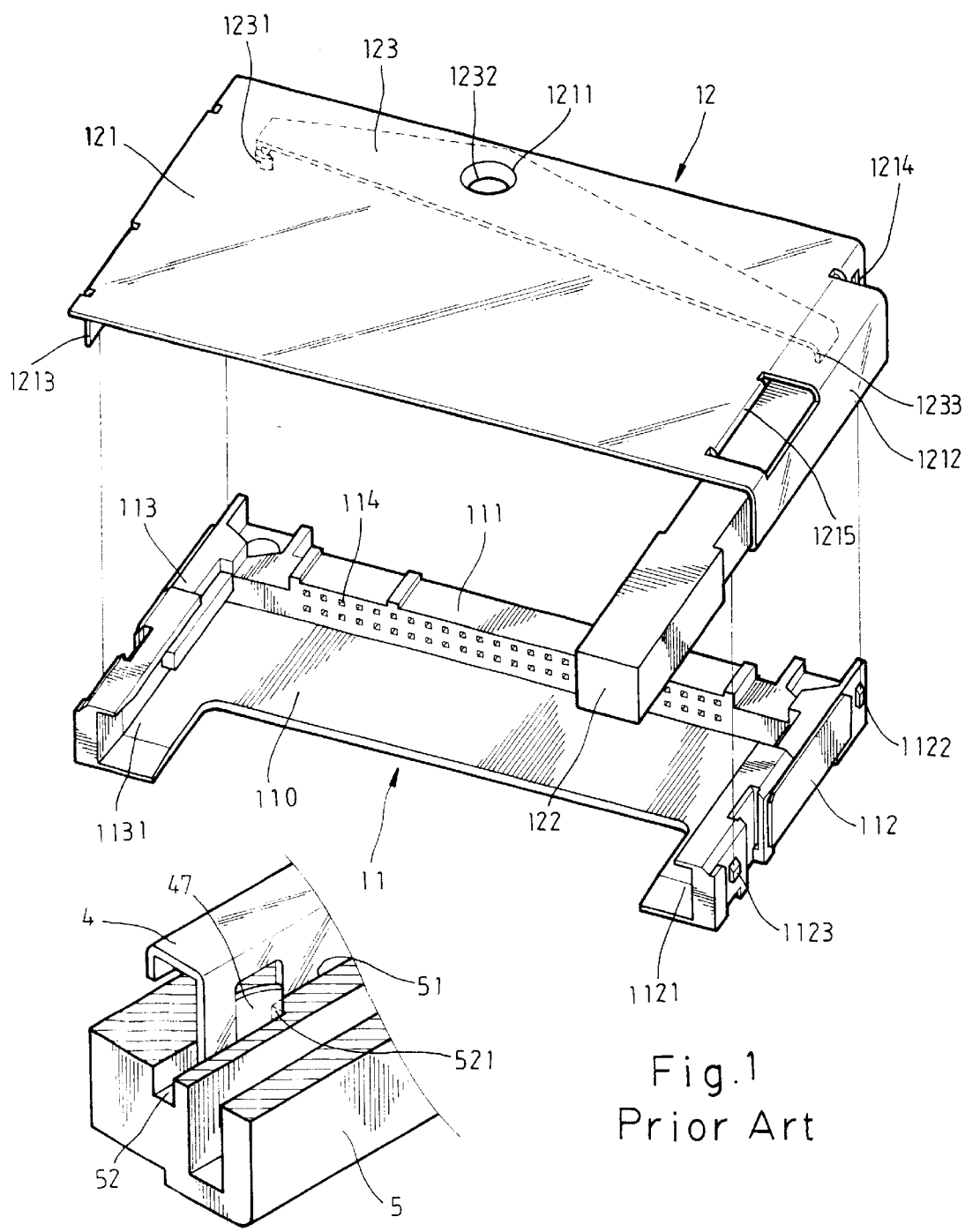
FIG. 1 is an exploded view of a memory card connector according to the prior art.
FIG. 2B is a sectional elevation in an enlarged scale of a part of the present invention.
Figure 3:
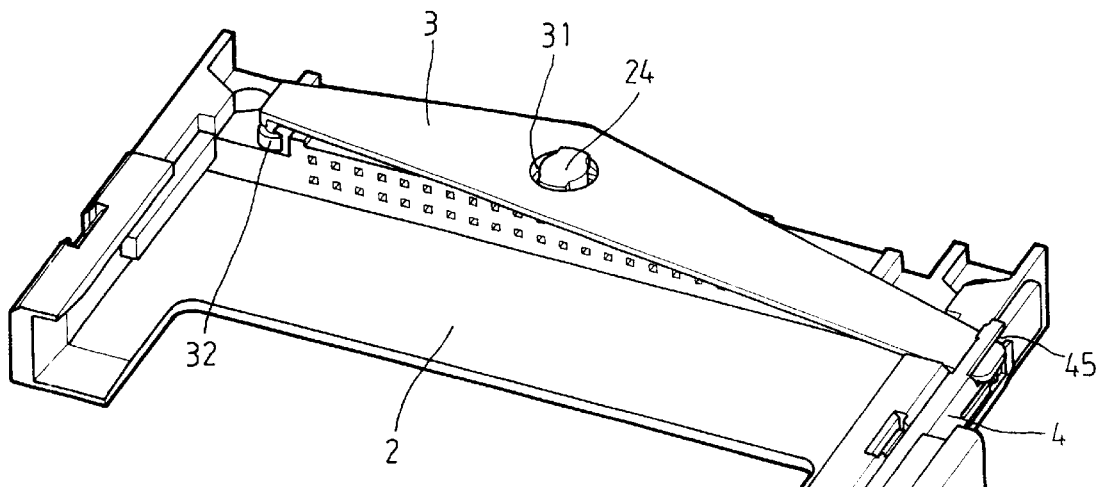
FIG. 3 is a perspective view of the memory card connector according to the present invention.

Referring to FIGS. 2 through 3, a memory card connector according to the present invention comprises a connector body 2, and an ejector mechanism. The ejector mechanism comprises a lever 3, a push bar 4, and an operating bar 5. The connector body 2 comprises an elongated terminal holder base 21 having rows of pin holes 211 for receiving the pins of the connector at a memory card (not shown), two side arms, namely, the first side arm 22 and the second side arm 23 perpendicularly extended from two distal ends of the elongated terminal holder base 21 in same direction, a flat receiving chamber 20 defined between the side arms 22 and 23 for receiving a memory card, two sliding grooves 221 and 231 respectively provided at the side arms 22 and 23 at an inner side for guiding a memory card into the flat receiving chamber 20, a track 222;225 of substantially T-shaped cross section formed integral with first side arm 22 at an outer side and defining parallel coupling grooves 223, a notch 227 provided at the first side arm 22 at an outer side cross the track and separating the track into two track portions 222 and 225, and a coupling rod 24 raised from the top side wall of the holder base 21 on the middle. The coupling rod 24 comprises a shank 241, and a coupling head 242 at the top end of the shank 241. The lever 3 comprises a coupling hole 31 on the middle coupled to the coupling rod 24 at the connector body 2, two coupling flanges 311 suspended in the coupling hole 31 at two opposite sides, a downward stop portion 32 at one end, and a flat connecting portion 33 at an opposite end. The push bar 4 comprises two longitudinal coupling flanges 41 for coupling to the coupling grooves 223 at the connector body 2 for enabling the push bar 4 to be moved along the track portions 222 and 225, a front guide strip 43 axially extended from one end thereof, two axially extended front stop portions 46, a longitudinal coupling notch 45 defined between the front guide strip 43 and the front stop portions 46 and coupled to the flat connecting portion 33 of the lever 3, an inwardly extended protruding portion 42, which is suspended in the notch 227 at the connector body 2 to limit the sliding distance of the push bar 4 on the track portions 222 and 225 after the push bar 4 has been coupled to the track portions 222 and 225, a tongue 44 projecting from the front guide strip 43 for supporting on the track portion 225, and a springy hook portion 47 raised from the rear end thereof remote from the front guide strip 43. The operating bar 5 is coupled to the push bar 4, comprising a coupling hole 51, which receives one end of the push bar 4, a locating hole 52 extended to one end thereof, a step 521 defined between the coupling hole 51 and the locating hole 52 for engagement with the springy hook portion 47 of the push bar 4 upon insertion of the push bar 4 into the coupling hole 51, and a finger rod 53 disposed at an outer side for the holding of the fingers.

Figure 4:
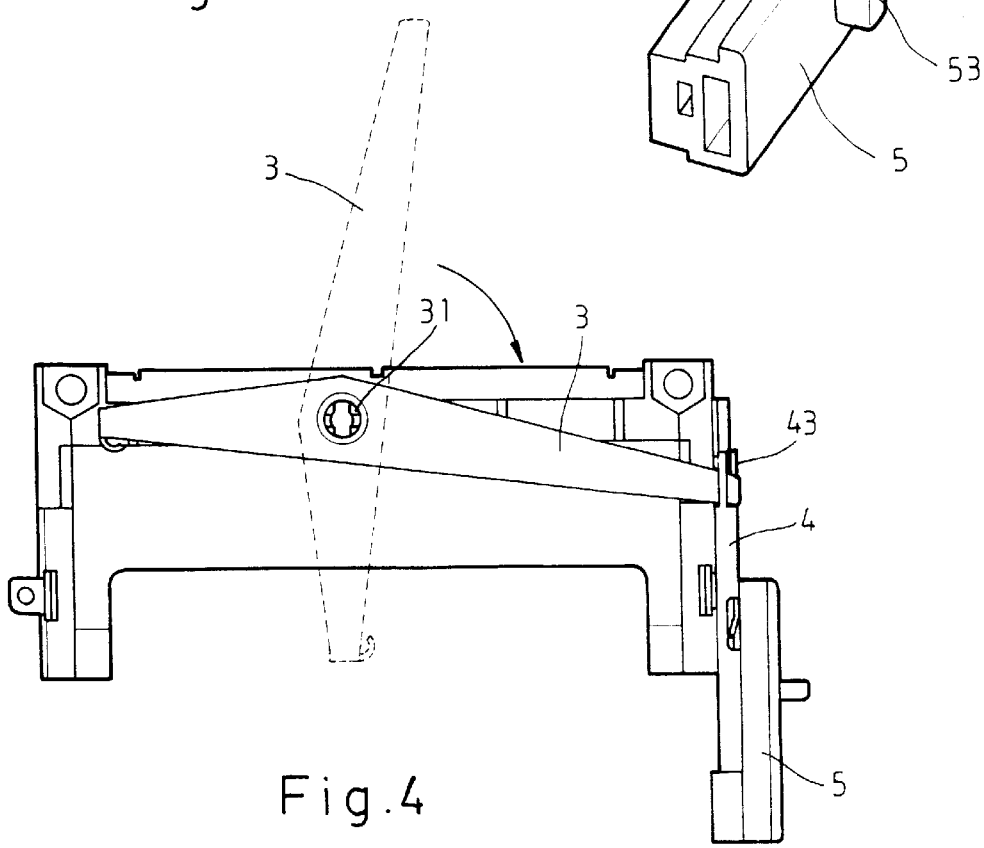
FIG. 4 is a schematic drawing showing the lever operated according to the present invention.

After connection of the push bar 4 and the operating bar 5, the push bar 4 is coupled to the track portions 222 and 225 at the connector body 2, and the lever 3 is coupled between the coupling rod 24 and the push bar 4 by: inserting the flat connecting portion 33 into the coupling notch 45 at the push bar 4, then coupling the coupling hole 31 to the coupling rod 24, then turning the push bar 4 about the shank 241 of the coupling rod 24 through an angle for enabling the coupling head 242 to be stopped above the coupling flanges 311 in flush with the top side wall of the lever 3 (see FIG. 3). Through the finger rod 53, the operating bar 5 can be pushed by hand to move the push bar 4, causing the lever 3 to be turned about the coupling rod 24, so as to further disconnect the installed memory card (not shown) from the holder base 21 of the connector body 2 (see FIG. 4).

While only one embodiment of the present invention has been shown and described, it will be understood that various modifications and changes could be made thereunto without departing from the spirit and scope of the invention disclosed.

What the invention claimed is:

1. A memory card connector comprising:
   a connector body, said connector body comprising an elongated terminal holder base having rows of pin holes for receiving pins of a connector of a memory card, a first side arm and a second side arm perpendicularly extended from two ends of said terminal holder base, said first side arm is parallel to said second side arm, and a coupling rod raised from a top side of said terminal holder base, said coupling rod comprising a shank and a coupling head formed integrally;
   a lever having a coupling hole coupled to said coupling rod, said lever also including a flat connecting portion and a downward stop portion that abuts the memory card installed in said connector body;
   a push bar that moves along the first side arm of said connector body for turning said lever to push the installed memory card away from said connector body, said push bar having a rear end and a front end that is coupled to the flat connecting portion of said lever;
   wherein said lever comprises two coupling flanges suspended in said coupling hole at two opposite sides and forced into engagement with the coupling head of said coupling rod upon a rotary motion of said lever through an angle relative to said coupling rod after insertion of said coupling rod through the coupling hole at said lever; and wherein
   said first side arm of said connector body defines a longitudinal track, and said push bar comprises two longitudinal coupling flanges coupled to said longitudinal track and moved with said push bar along said longitudinal track.

2. The memory card connector of claim 1 wherein said track has a T-shaped cross section defining two longitudinal coupling grooves to position the longitudinal coupling flanges of said push bar.

3. The memory card connector of claim 2 wherein said first side arm comprises a notch transversely extended across said track and separating said track into two track portions, and said push bar comprises a protruding portion suspended in the notch at said first side arm to limit sliding distance of said push bar on said track.

4. The memory card connector of claim 3 wherein said push bar comprises a coupling notch at a front end thereof coupled to the flat connecting portion of said lever.

5. The memory card connector of claim 4 wherein said push bar comprises stop means at the front end for stopping the flat connecting portion of said lever in the coupling notch at said push bar.

6. The memory card connector of claim 5 wherein said push bar comprises a tongue stopped at said track to guide movement of said push bar on said track.

7. The memory card connector of claim 6 further comprising an operating bar coupled to the rear end of said push bar remote from the front end of said push bar for operation by hand to move said push bar along said track, said operating bar having a finger rod at an outer side thereof.

8. The memory card connector of claim 7 wherein said operating bar comprises a coupling hole, said coupling hole of said operating bar receives the rear end of said push bar, said operating bar further comprises a locating hole at one end thereof and a step defined between the coupling hole and locating hole, and said push bar comprises a springy hook portion which is hooked on the step of said operating bar.

\* \* \* \* \*